(12) United States Patent
Kuo et al.

(10) Patent No.: US 8,829,537 B2
(45) Date of Patent: Sep. 9, 2014

(54) INTEGRATED APPARATUS INCLUDING DRIVER CHIPS, A POWER SUPPLY AND LED CHIPS ON AN ISOLATIVE SUBSTRATE

(75) Inventors: Yang-Kuao Kuo, Taoyuan County (TW); Chin-Peng Wang, Taoyuan County (TW); Lea-Hwung Leu, Taoyuan County (TW)

(73) Assignee: Chung-Shan Institute of Science and Technology, Armaments, Bureau, Ministry of National Defense, Taoyuan County (TW)

( * ) Notice: Subject to any disclaimer, the term of this patent is extended or adjusted under 35 U.S.C. 154(b) by 46 days.

(21) Appl. No.: 13/239,569

(22) Filed: Sep. 22, 2011

(65) Prior Publication Data

US 2013/0032826 A1 Feb. 7, 2013

(30) Foreign Application Priority Data

Aug. 4, 2011 (TW) .............................. 100127714 A

(51) Int. Cl.
*H01L 33/00* (2010.01)
*F21V 29/00* (2006.01)
*H05K 1/02* (2006.01)
*F21V 23/00* (2006.01)
*H05B 33/08* (2006.01)
*H05K 1/03* (2006.01)
*H01L 25/075* (2006.01)
*H05K 3/00* (2006.01)
*F21Y 101/02* (2006.01)
*F21Y 105/00* (2006.01)

(52) U.S. Cl.
CPC ............ *F21V 23/005* (2013.01); *H05K 1/0306* (2013.01); *H05K 2201/10106* (2013.01); *F21V 29/004* (2013.01); *H01L 25/0753* (2013.01); *Y02B 20/341* (2013.01); *H05K 1/0203* (2013.01); *H05K 3/0061* (2013.01); *F21Y 2101/02* (2013.01); *F21V 29/225* (2013.01); *H05B 33/0803* (2013.01); *F21V 29/246* (2013.01); *F21Y 2105/001* (2013.01)
USPC ......................... 257/79; 362/249.01; 362/294

(58) Field of Classification Search
USPC .............. 257/99, 79, 88; 362/249.01, 249.02, 362/249.05, 294
See application file for complete search history.

(56) References Cited

U.S. PATENT DOCUMENTS

| | | | |
|---|---|---|---|
| 8,118,450 B2* | 2/2012 | Villard | 362/249.02 |
| 2004/0022038 A1* | 2/2004 | Figueroa et al. | 361/763 |
| 2007/0158827 A1* | 7/2007 | Schuster | 257/723 |
| 2008/0316750 A1* | 12/2008 | Park | 362/294 |
| 2009/0316389 A1* | 12/2009 | Park et al. | 362/97.1 |
| 2012/0146539 A1* | 6/2012 | Riesebosch | 315/291 |
| 2012/0153299 A1* | 6/2012 | Yang | 257/77 |

* cited by examiner

*Primary Examiner* — Matthew W Such
*Assistant Examiner* — Ali Naraghi
(74) *Attorney, Agent, or Firm* — Jackson IPG PLLC

(57) ABSTRACT

Disclosed is an integrated apparatus including an isolative substrate, a plurality of driver chips provided on a side of the isolative substrate, a power supply provided on the side of the isolative substrate and electrically connected to the driver chips, and LED chips provided on another side of the isolative substrate and electrically connected to the driver chips. Thus, the driver chips, the power supply and the LED chips are integrated on the isolative substrate. The production is easy. The integrated apparatus is not vulnerable to surges and lightning strikes. Electromagnetic interferences are reduced. Heat radiation of the integrated apparatus is excellent so that the LED chips are protected from thermal effect.

3 Claims, 5 Drawing Sheets

INTEGRATED APPARATUS INCLUDING DRIVER CHIPS, A POWER SUPPLY AND LED CHIPS ON AN ISOLATIVE SUBSTRATE

BACKGROUND OF INVENTION

1. Field of Invention

The present invention relates to driver chips for LED devices and, more particularly, to an apparatus in which a plurality of driver chips, a power supply and a plurality of LED chips are integrated on an integrated isolative substrate for easy manufacturing, preventing surges, protection against lightning strikes, reducing electromagnetic interferences, and improving heat radiation to prevent thermal effect.

2. Related Prior Art

More and more attention has been paid to the protection of the environment. Accordingly, there is an on-going trend to improve energy efficiency. The LED industry is a promising one because LED devices are energy efficient, efficient, fast to react, long in life, mercury-free and environmentally friendly.

Regarding the development of a heat radiation substrate of a high-voltage driver IC, the high-luminance LED chips and a package are included in a module and a driver IC is included in another module in a conventional design. In the conventional design, the driver IC must be modularized, and the cost is therefore high and the heat radiation is therefore poor.

Furthermore, an LED device converts only about 20% of electricity into light but converts the other portion of the electricity into heat. In most cases, the heat is transferred to a substrate from at least one LED chip and then transferred to a system-class circuit board from the substrate. Finally, the heat is released into the environment from the system-class circuit board.

However, an LED device is often expected to provide high luminance, last for a long period of time and operate stably. Many LED-based street lamps are used currently. A requirement for an LED-based street lamp is that its luminous decay must be lower than 20% for at least thirty thousand hours of operation. Most of the current LED-based street lamps however stop to operate before thirty thousand hours of operation. One third of the reasons why they fail are attributed to unstable driver IC. The primary reason for an unstable driver IC is failure to radiate heat from the driver IC fast enough.

The present invention is therefore intended to obviate or at least alleviate the problems encountered in prior art.

SUMMARY OF INVENTION

It is the primary objective of the present invention to provide an integrated apparatus with a plurality of driver chips, a power supply and a plurality of LED chips integrated on an isolative substrate for easy manufacturing, preventing surges, protection against lightning strikes, reducing electromagnetic interferences, and improving heat radiation to prevent thermal effect.

To achieve the foregoing objective, the integrated apparatus includes an isolative substrate, a plurality of driver chips, a power supply and a plurality of LED chips. The isolative substrate is formed with two sides. The driver chips are provided on the first side of the isolative substrate. The power supply is provided on the first side of the isolative substrate and electrically connected to the driver chips. The LED chips are provided on the second side of the isolative substrate and electrically connected to the driver chips.

In the foregoing aspect, the isolative substrate may be an aluminum nitride substrate.

In the foregoing aspect, the integrated apparatus may further include a heat radiation unit provided on the first side of the isolative substrate.

In the foregoing aspect, the heat radiation unit may be made of copper or aluminum.

In the foregoing aspect, the integrated apparatus may further include a circuit layout layer provided on the first side of the isolative substrate by through-silicon-vias so that the driver chips are electrically connected to the LED chips via the circuit layout layer.

In the foregoing aspect, the LED chips may be high luminance LED chips.

In another aspect, the integrated apparatus includes an isolative substrate, a power supply and a plurality of LED chips. The isolative substrate is formed with a first side and a second side. The power supply is provided on the first side of the isolative substrate and electrically connected to the driver chips. The LED chips are provided on the second side of the isolative substrate and electrically connected to the power supply.

In the foregoing aspect, the isolative substrate may be an aluminum nitride substrate.

In the foregoing aspect, the integrated apparatus may further include a plurality of driver chips, a heat radiation unit and a circuit layout layer. The driver chips are provided on the first side of the isolative substrate. The heat radiation unit is provided on the first side of the isolative substrate. The circuit layout layer is formed on the first side of the isolative substrate by through-silicon-vias. The driver chips are electrically connected to the LED chips via the circuit layout layer.

In the foregoing aspect, the heat radiation unit may be made of copper or aluminum.

In the foregoing aspect, the LED chips may be high luminance LED chips.

In another aspect, the integrated apparatus includes an isolative substrate and a power supply. The isolative substrate is formed with two sides. The power supply is provided on the first side of the isolative substrate.

In the foregoing aspect, the isolative substrate may be an aluminum nitride substrate.

In the foregoing aspect, the integrated apparatus may further include a plurality of driver chips, a heat radiation unit, a plurality of LED chips and a circuit layout layer. The driver chips are provided on the side of the isolative substrate. The heat radiation unit is provided on the first side of the isolative substrate. The LED chips are provided on the second side of the isolative substrate and electrically connected to the power supply. The circuit layout layer is formed on the first side of the isolative substrate by through-silicon-vias. The driver chips are electrically connected to the LED chips via the circuit layout layer.

In the foregoing aspect, the heat radiation unit may be made of a material selected from the group consisting of copper and aluminum.

In the foregoing aspect, the LED chips may be high luminance LED chips.

Other objectives, advantages and features of the present invention will be apparent from the following description with reference to the attached drawings.

BRIEF DESCRIPTION OF DRAWINGS

The present invention will be described via detailed illustration of three embodiments with reference to the drawings wherein.

DETAILED DESCRIPTION OF EMBODIMENTS

Figure 1:
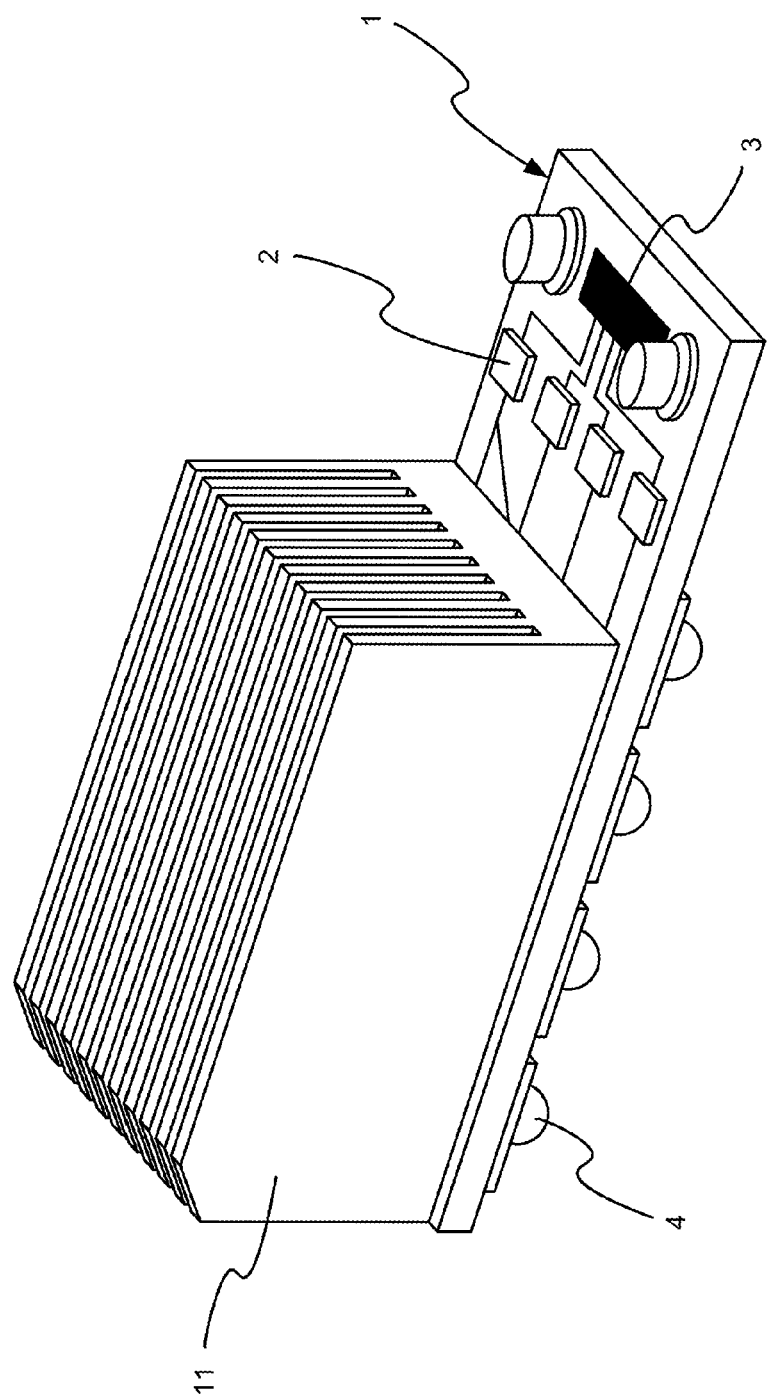
FIG. 1 is a perspective view of an integrated apparatus in accordance with the preferred embodiment of the present invention.
Figure 2:
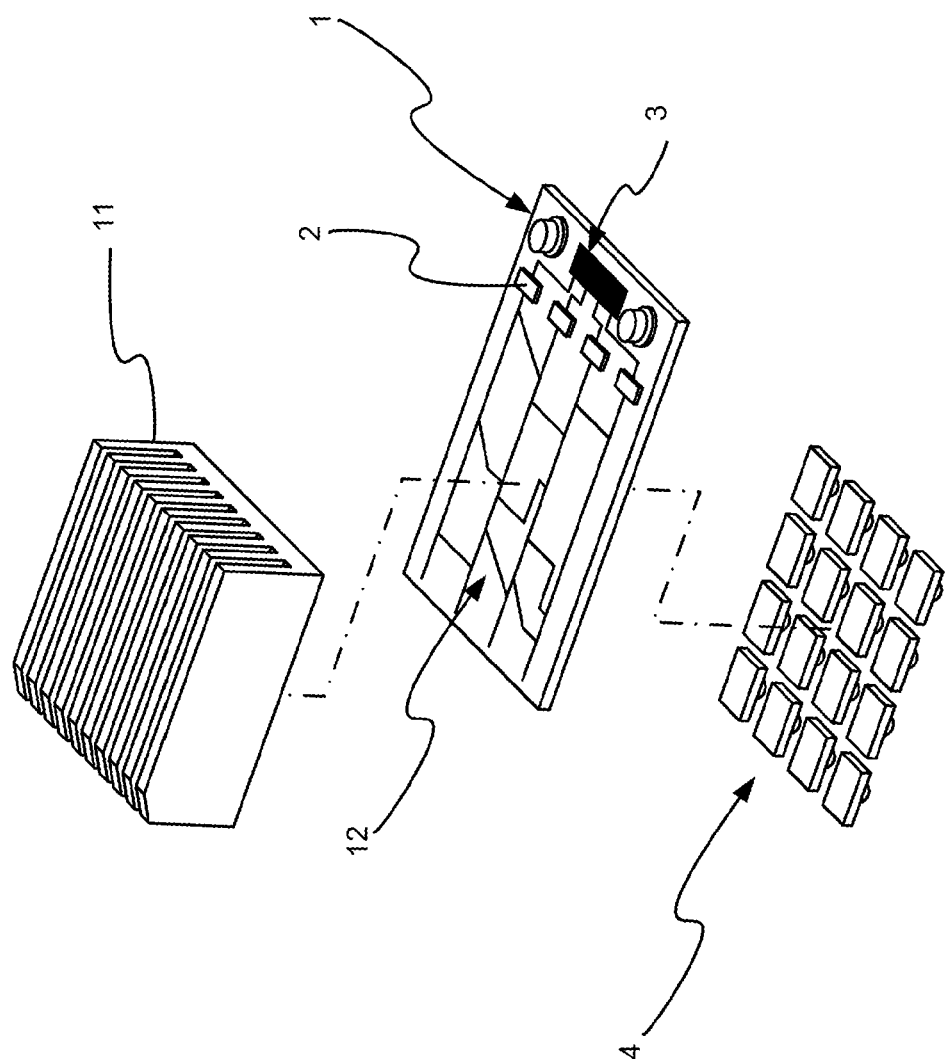
FIG. 2 is an exploded view of the integrated apparatus shown in FIG. 1.
Figure 3:
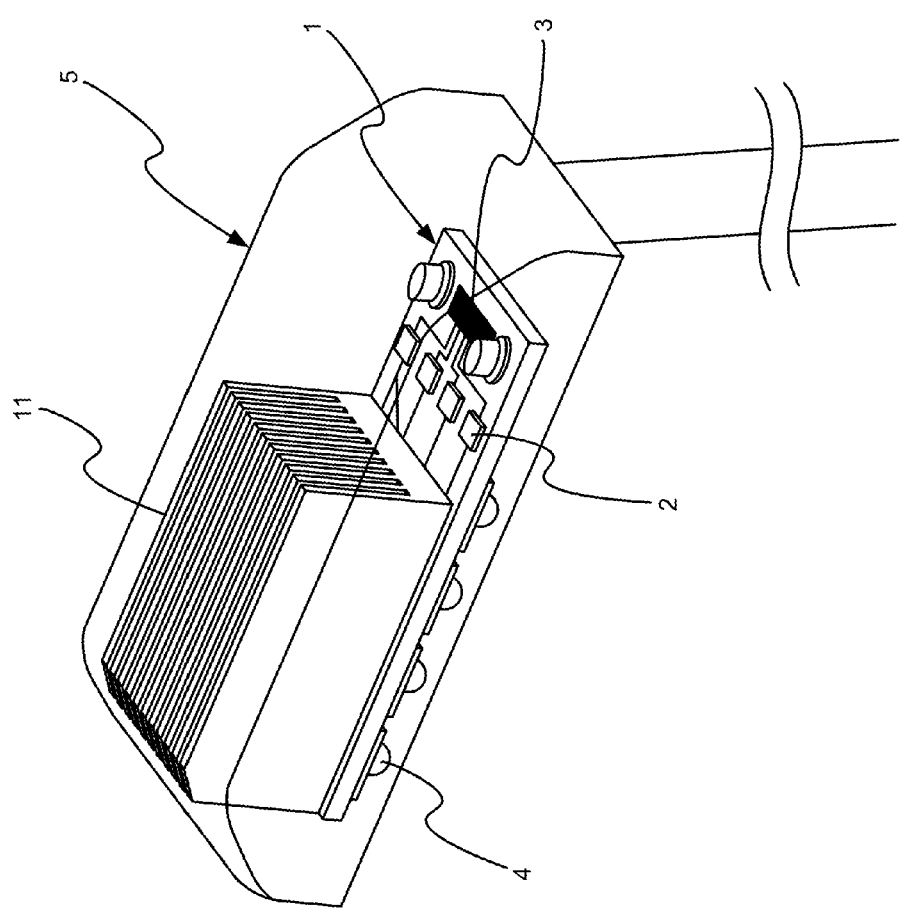
FIG. 3 is a perspective view of a shell and the integrated apparatus shown in FIG. 1.

With reference to FIGS. 1 through 3, there is shown an integrated apparatus in accordance with a first embodiment of the present invention. The integrated apparatus includes an isolative substrate 1, a plurality of driver chips 2, a power supply 3 and a plurality of LED chips 4.

The isolative substrate 1 is preferably an aluminum nitride substrate. There is preferably a heat radiation unit 11 provided on a first side of the isolative substrate 1. The heat radiation unit 11 may be made of copper or aluminum.

The driver chips 2 are also provided on the first side of the isolative substrate 1.

The power supply 3 is also provided on the first side of the isolative substrate 1 and electrically connected to the driver chips 2.

The LED chips 4 are provided on a second side of the isolative substrate 1 and electrically connected to the driver chips 2. The LED chips 4 are high luminance LED chips.

The isolative substrate 1 includes a circuit layout layer 12 provided on the first side thereof by through-silicon-vias ("TSV"). The driver chips 2 are electrically connected to the LED chips 4 via the circuit layout layer 12. Thus, the driver chips 2, the power supply 3 and the LED chips 4 are integrated on the isolative substrate 1 so that the integrated apparatus can easily be made.

In use, the driver chips 2, the power supply 3 and the LED chips 4 are integrated on the isolative substrate 1 before they are located in a shell 5. The driver chips 2 are used with the power supply 3 to actuate the LED chips 4 to emit light. When the LED chips 4 produce heat when it emits the light, the heat is transferred to the isolative substrate 1 and the heat radiation unit 11 before it is released to the environment. Thus, the heat is not accumulated in the integrated apparatus and is dissipated. Accordingly, the LED chips 4 are protected from thermal effect. Moreover, the driver chips 2, the power supply 3 and the LED chips 4 are integrated on the isolative substrate 1 for preventing surges, protection against lightning strikes, and reducing electromagnetic interferences in use.

Figure 4:
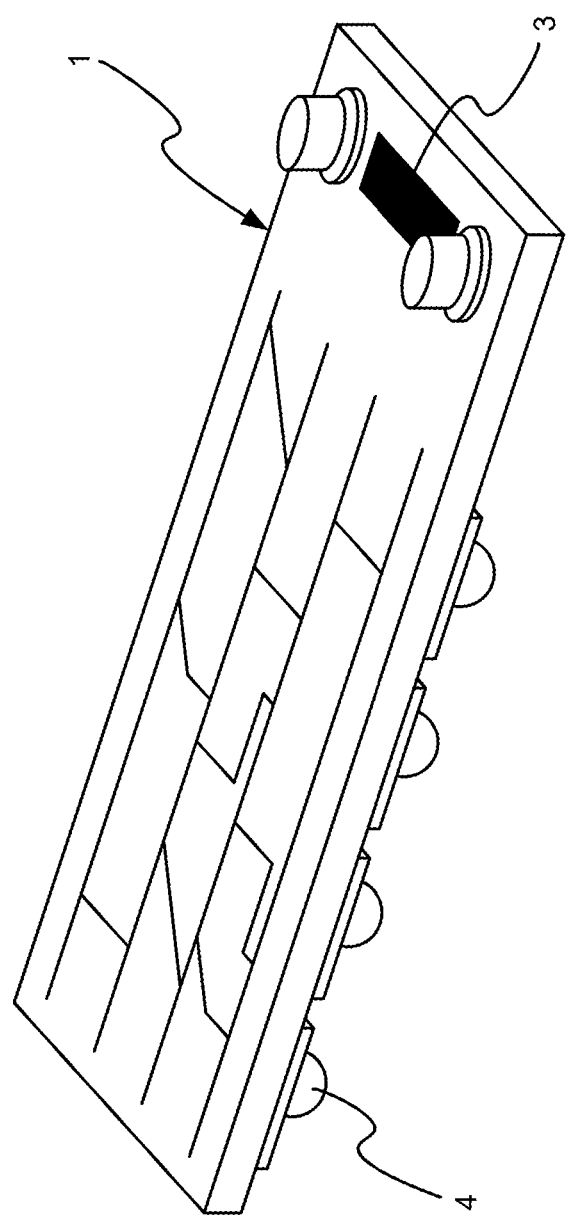
FIG. 4 is a perspective view of an integrated apparatus in accordance with the second embodiment of the present invention.

With reference to FIG. 4, there is shown an integrated apparatus in accordance with a second embodiment of the present invention. The second embodiment is identical to the first embodiment except for saving the driver chips 2. That is, the integrated apparatus only includes the power supply 3 provided on the first side of the isolative substrate 1 and the LED chips 4 provided on the second side of the isolative substrate 1. The power supply 3 is electrically connected to the LED chips 4. In a following process, the driver chips 2 are electrically connected to the LED chips 4 later by through-silicon-vias to satisfy different needs in use.

Figure 5:
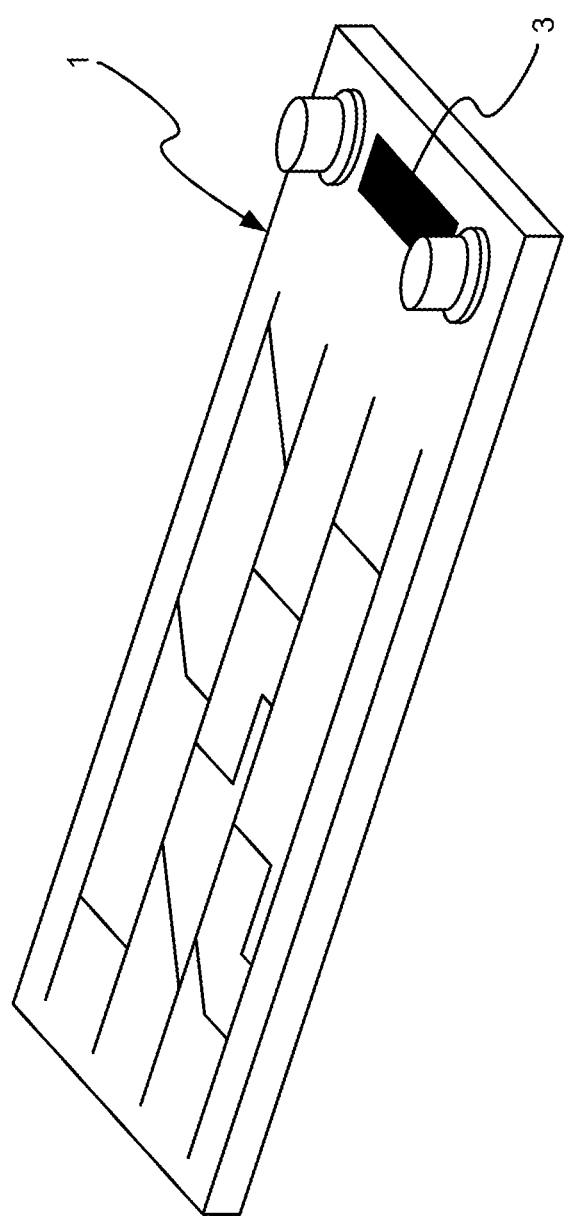
FIG. 5 is a perspective view of an integrated apparatus in accordance with the third embodiment of the present invention.

With reference to FIG. 5, there is shown an integrated apparatus in accordance with a third embodiment of the present invention. The third embodiment is identical to the first embodiment except for saving the driver chips 2 and the LED chips 4. That is, the integrated apparatus only includes the power supply 3 provided on the first side of the isolative substrate 1. In a following process, the driver chips 2, the power supply 3 and the LED chips 4 are electrically connected to the power supply 3 via through-silicon-vias to satisfy different needs in use.

As discussed above, the integrated apparatus of the present invention overcome the problems encountered in the prior art. In the integrated apparatus, a plurality of driver chips, a power supply and a plurality of LED chips are integrated on an integrated isolative substrate for easy manufacturing, preventing surges, protection against lightning strikes, reducing electromagnetic interferences, and improving heat radiation to prevent thermal effect.

The present invention has been described via the detailed illustration of the embodiments. Those skilled in the art can derive variations from the embodiments without departing from the scope of the present invention. Therefore, the embodiments shall not limit the scope of the present invention defined in the claims.

The invention claimed is:

1. An integrated apparatus including:
    an electrically insulative and thermally conductive substrate formed with a first side and an opposite second side and comprising a circuit layout layer provided on the first side of the electrically insulative and thermally conductive substrate, the circuit layout layer comprising through-silicon-vias;
    a plurality of driver chips provided on the first side of the electrically insulative and thermally conductive substrate;
    a power supply provided on the first side of the electrically insulative and thermally conductive substrate and electrically connected to the driver chips;
    a heat radiation unit provided on the first side of the electrically insulative and thermally conductive substrate so as to overlie the circuit layout layer and such that the circuit layout layer is interposed between the heat radiation unit and the electrically insulative and thermally conductive substrate; and
    a plurality of LED chips provided on the opposite second side of the electrically insulative and thermally conductive substrate opposite the heat radiation unit and electrically connected to the driver chips via the circuit layout layer.

2. The integrated apparatus in accordance with claim 1, wherein the electrically insulative and thermally conductive substrate is an aluminum nitride substrate.

3. The integrated apparatus in accordance with claim 1, wherein the heat radiation unit is made of a material selected from the group consisting of copper and aluminum.

* * * * *